United States Patent [19]

Lewandowski

[11] 4,061,988

[45] Dec. 6, 1977

[54] HALL EFFECT LINEAR MOTION SWITCH

[75] Inventor: Raymond F. Lewandowski, Mount Prospect, Ill.

[73] Assignee: Oak Industries Inc., Crystal Lake, Ill.

[21] Appl. No.: 656,106

[22] Filed: Feb. 9, 1976

[51] Int. Cl.² .................. H01L 43/04; H01L 43/06
[52] U.S. Cl. .................................. 338/32 H; 335/2
[58] Field of Search ................... 338/32 H, 32 R; 323/94 H; 324/45, 46; 335/1, 2

[56] References Cited

U.S. PATENT DOCUMENTS

| 3,571,774 | 3/1971 | Hubrich | 338/32 R |
| 3,673,537 | 6/1972 | Greger | 338/32 R X |

*Primary Examiner*—C. L. Albritton
*Attorney, Agent, or Firm*—Kinzer, Plyer, Dorn & McEachran

[57] ABSTRACT

A contactless linear motion switch has a housing and a Hall effect sensing circuit positioned within the housing. A plunger carrying a permanent magnet moves within the housing toward and away from the Hall effect sensing circuit. A concentrator is positioned within the housing and has a portion positioned adjacent the Hall effect sensing circuit and a further portion positioned in contact with the permanent magnet when the magnet is positioned away from the Hall effect sensing circuit.

9 Claims, 6 Drawing Figures

HALL EFFECT LINEAR MOTION SWITCH

SUMMARY OF THE INVENTION

The present invention relates to contactless linear motion switches using Hall effect sensing circuits.

A primary purpose of the invention is a switch of the type described including a member which is effective to concentrate the magnetic flux through the Hall effect sensing device.

Another purpose is a switch of the type described in which a concentrator is positioned in contact with the magnet when the magnet and plunger are in the unoperated position.

Another purpose is a structure of the type described in which cooperation between the permanent magnet and concentrator prevents accidental operation of the switch.

Another purpose is a linear motion contactless switch having a shorter stroke than prior switches of this general type.

Another purpose is a Hall effect pushbutton switch which can utilize a weaker permanent magnet than heretofore possible.

Another purpose is a contactless switch of the type described which provides a tactile feel when the switch is operated.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

Figure 1:
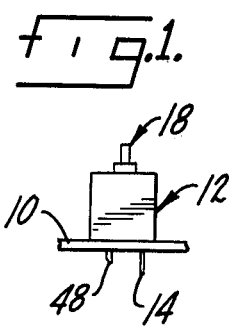
FIG. 1 is a side view of a switch of the type described.
Figure 2:
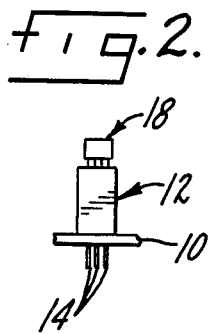
FIG. 2 is an end view of the switch of FIG. 1.

The present invention utilizes Hall effect sensing circuits in which the presence of an adjacent magnetic field is effective to provide an output current from the sensing circuit. The particular type of Hall effect sensing circuit may vary, although the ULN-3019 manufactured by Sprague Electric Company has been found to be satisfactory for purposes of the present structure. This particular semiconductor chip includes a voltage regulator, a Hall effect sensor, a Schmitt trigger circuit, and an output amplifier. Movement of a magnet, for example a permanent magnet, into a position adjacent the Hall effect sensing circuit provides an output signal which may perform a switching function. Thus, linear movement of a permanent magnet will operate the switch.

In the drawings, a printed circuit board is indicated at 10 and may mount a Hall effect linear motion switch indicated generally at 12. Terminals from the switch are indicated at 14 and there may be three such terminals, although the number of terminals will vary, depending upon the desired switching function.

Looking particularly at FIGS. 3–6, switch 12 includes a housing 16, which may conveniently be formed of plastic or the like, mounting a plunger indicated generally at 18. Housing 16 includes an irregularly-shaped chamber 20 having a shelf 22 along one side thereof. A Hall effect sensing circuit 24 is positioned on shelf 22 and its terminals 14 extend out through a series of spaced openings 26 illustrated particularly in FIG. 5.

Plunger 18 includes a lower cylindrical portion 28 which is positioned to extend through a circular opening 30 in the base of housing 16, a central body portion 32 and an upper operating portion or button 34 which extends outwardly from housing 16. Body portion 32 has an irregularly-shaped opening 36 with a permanent magnet 38 resting on the bottom surface 40 of opening 36, as particularly shown in FIG. 4. Thus, movement of plunger 18 in a linear direction will cause magnet 38 to be moved from the position of FIG. 4 to a position in which it is directly adjacent Hall effect chip 24.

Figure 4:
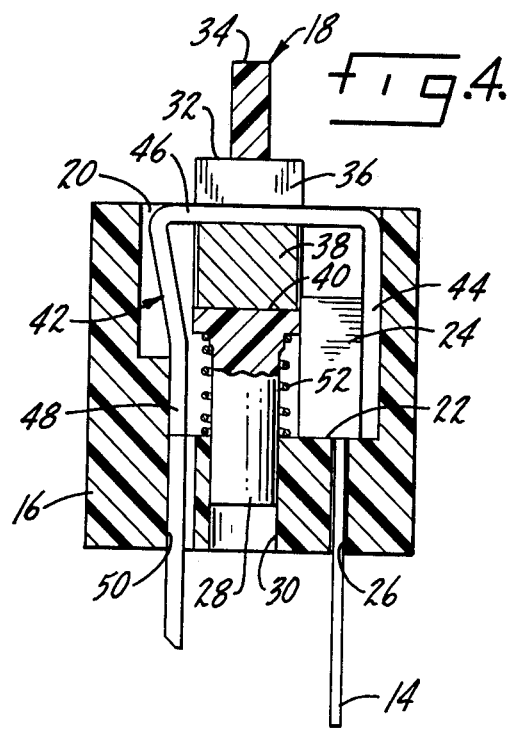
FIG. 4 is a section along plane 4—4 of FIG. 3.
Figure 5:
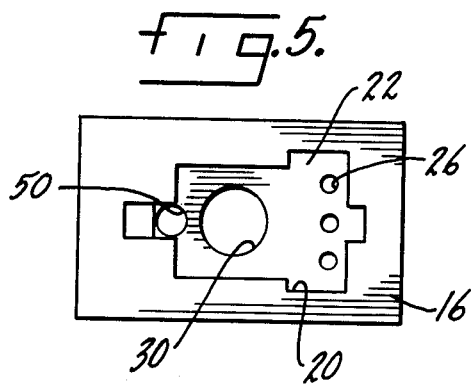
FIG. 5 is a top plan view of the switch housing.
Figure 6:
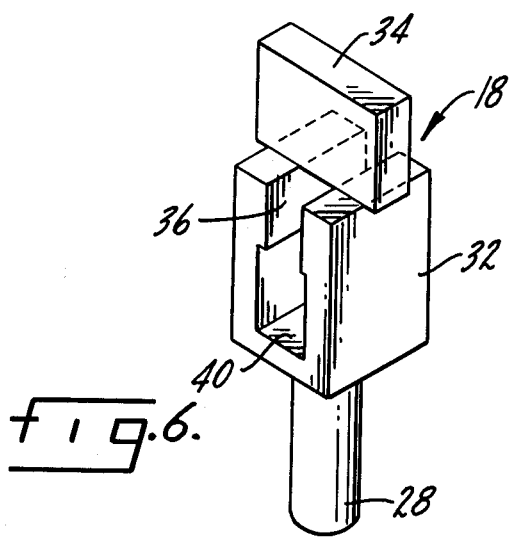
FIG. 6 is a perspective of the switch plunger.
Figure 3:
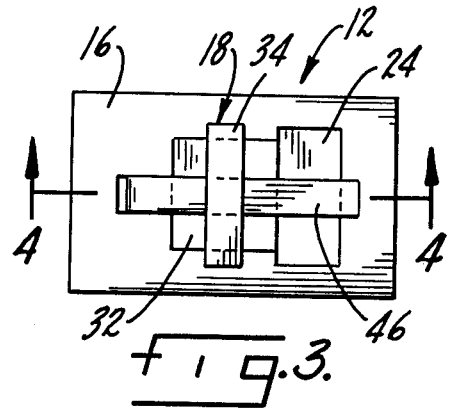
FIG. 3 is an enlarged top plan view of the switch.

A concentrator 42 may have a somewhat U-shaped configuration, as illustrated particularly in FIG. 4. One arm 44 of concentrator 42 extends within chamber 20 along one side thereof and between the housing and Hall effect circuit 24. Thus, the concentrator, which is preferably formed of steel or the like, is useful in concentrating the magnetic flux as will be described in more detail hereinafter. The base of concentrator 42 is indicated at 46 and extends through an upper portion of opening 36 in plunger 18, and when the switch is in the unoperated position of FIG. 4, portion 46 is directly in contact with permanent magnet 38. The opposite arm 48 of concentrator 42 extends outwardly through an opening 50 in housing 16 for attachment to printed circuit board 10. Thus, the concentrator may provide a secure means of attaching the switch to a printed circuit board.

The switch may be completed by a coil spring 52 surrounding cylindrical portion 28 of plunger 18, with the upper coil of the spring bearing against the bottom surface of body portion 32 of the plunger and the lower coil of the spring resting upon shelf 22 of housing 16.

The unoperated position of the switch is illustrated in FIG. 4. Permanent magnet 38 is in contact with concentrator portion 46. When the operating portion 34 of the plunger is pushed downwardly, as is conventional in pushbutton switches, there will be a feel, commonly called a "tactile feel", of the switch being operated as the magnet breaks away from the concentrator. This has the distinct advantage of letting the operator know that in fact the switch has been operated. This is particularly helpful in miniature switches in which the stroke of the switch is quite small. As plunger 18 is moved into housing 16, magnet 38 will be moved to a position where it is directly opposite Hall effect circuit 24. The presence of the magnetic field adjacent the sensing circuit will cause an output from the sensing circuit on terminals 14, which output may be used in a conventional manner. The presence of concentrator portion 44 behind Hall effect sensing circuit 24 has the effect of concentrating the lines of force of the magnet directly through the Hall chip. Thus, a weaker magnet than normal may be used to provide the same output as the concentrator tends to cause substantially all of the lines of force of the magnet to be directed through chip 24.

As the switch is arranged for momentary operation, when button 34 is released, the switch will return to the position of FIG. 4 through the force of spring 52.

An advantage of having magnet 38 in contact with concentrator portion 46 in the unoperated position is that the lines of force from the magnet will tend to be concentrated by the metal of portion 46, thus preventing any stray magnetic fields from causing accidental operation of chip 24. By virtue of having the concentrator for the magnetic lines of force it is possible to have a device which has a shorter stroke. In prior types of similar switches it was necessary to have a substantial distance between the magnet and the Hall chip in the unoperated position so as to insure there would be no accidental operation of the chip. This is not necessary in the present structure since the force lines are concentrated on the opposite side or away from the chip by the above-described cooperation of elements.

Although a portion of the U-shaped concentrator has been shown as connected to a printed circuit board, this is not necessary in every application. In some structures arm 44 of the U-shaped concentrator may itself extend to the printed circuit board, thus eliminating any necessity for having an opposite arm. In this case the concentrator would be generally L-shaped.

Whereas the preferred form of the invention has been shown and described herein, it should be realized that there may be many modifications, substitutions and alterations thereto.

The embodiments of the invention in which an exclusive property or privilege is claimed are defined as follows:

1. In a contactless linear motion switch, a housing, a Hall effect sensing circuit positioned within said housing, a plunger positioned for movement in said housing, a permanent magnet carried by said plunger for movement toward and away from said Hall effect sensing circuit, and a concentrator fixed in position within said housing, said concentrator having a portion extending adjacent said Hall effect sensing circuit and a further portion positioned in contact with said magnet when said magnet is positioned away from said Hall effect sensing circuit.

2. The structure of claim 1 further characterized in that said concentrator portion extending adjacent said Hall effect sensing circuit is on the opposite side of said Hall effect sensing circuit from said plunger and magnet.

3. The structure of claim 2 further characterized by and including a chamber in said housing, said plunger being movable within said chamber, said concentrator being positioned within said chamber with said portion extending adjacent said Hall effect sensing circuit being positioned along a side of said chamber.

4. The structure of claim 1 further characterized by and including spring means normally biasing said plunger and magnet away from said Hall effect sensing circuit.

5. The structure of claim 1 further characterized in that said concentrator extends through an opening in said plunger.

6. The structure of claim 5 further characterized in that said concentrator portion extending through said plunger is positioned in contact with said magnet when said magnet is positioned away from the Hall effect sensing circuit.

7. The structure of claim 1 further characterized by and including a further portion of said concentrator extending outwardly from the housing and adapted for connection to a printed circuit board.

8. The structure of claim 1 further characterized in that said concentrator has a generally U-shaped cross section, with one side of the U being positioned adjacent said Hall effect sensing circuit and the base of the U being positioned adjacent and in contact with said magnet when said magnet is positioned away from said Hall effect sensing circuit.

9. The structure of claim 1 further characterized by and including an opening in said plunger, said magnet being positioned within said opening and said concentrator extending through said opening.

* * * * *